United States Patent
Joglekar

(10) Patent No.: US 9,722,112 B2
(45) Date of Patent: Aug. 1, 2017

(54) METHODS AND SEMICONDUCTOR MATERIALS SUITABLE FOR PHOTOVOLTAIC CELLS

(71) Applicant: Suneel Girish Joglekar, West Lafayette, IN (US)

(72) Inventor: Suneel Girish Joglekar, West Lafayette, IN (US)

(*) Notice: Subject to any disclaimer, the term of this patent is extended or adjusted under 35 U.S.C. 154(b) by 306 days.

(21) Appl. No.: 14/207,408

(22) Filed: Mar. 12, 2014

(65) Prior Publication Data
US 2014/0261665 A1 Sep. 18, 2014

Related U.S. Application Data

(60) Provisional application No. 61/851,752, filed on Mar. 12, 2013.

(51) Int. Cl.
*H01L 31/032* (2006.01)
*H01L 31/0749* (2012.01)

(52) U.S. Cl.
CPC ...... *H01L 31/0322* (2013.01); *H01L 31/0749* (2013.01); *Y02E 10/541* (2013.01)

(58) Field of Classification Search
CPC ........... H01L 31/0322; H01L 21/02623; H01L 21/02628
See application file for complete search history.

(56) References Cited

U.S. PATENT DOCUMENTS

2008/0121277 A1* 5/2008 Robinson .............. B22F 1/0055
136/256
2008/0175982 A1* 7/2008 Robinson ............ H01L 31/0322
427/74

* cited by examiner

*Primary Examiner* — Laura Menz
*Assistant Examiner* — Candice Y Chan
(74) *Attorney, Agent, or Firm* — Hartman Global IP Law; Gary M. Hartman; Domenica N. S. Hartman

(57) ABSTRACT

Methods and semiconductor materials produced by such methods that are suitable for use in photovoltaic cells, solar cells fabricated with such methods, and solar panels composed thereof. Such methods include a wet-chemical synthesis method capable of producing a Group I-III-VI$_2$ semiconductor material by forming a solution containing an organic solvent, at least one Group I precursor of at least one Group I element, and at least one Group III precursor of at least one Group III element. The Group I precursor is present in the solution in an amount of less than 120% of a stoichiometric ratio of the Group I element in the Group I-III-VI$_2$ semiconductor material, and the Group III precursor is present in the solution in an amount of greater than 55% of a stoichiometric ratio of the Group III element in the Group I-III-VI$_2$ semiconductor material.

16 Claims, 18 Drawing Sheets

METHODS AND SEMICONDUCTOR MATERIALS SUITABLE FOR PHOTOVOLTAIC CELLS

CROSS REFERENCE TO RELATED APPLICATIONS

This application claims the benefit of U.S. Provisional Application No. 61/851,752, filed Mar. 12, 2013, the contents of which are incorporated herein by reference.

BACKGROUND OF THE INVENTION

The present invention relates to photovoltaic cells and fabrication methods thereof. More specifically, the present invention relates to organic synthesis processes for fabricating semiconductor nanoparticles for use in high-efficiency photovoltaic cells.

Photovoltaics generate electrical power by converting solar energy into direct current electricity through the use of semiconductors that exhibit the photovoltaic effect. The photovoltaic effect is the generation of current or electric charge in a material upon exposure to light. Photovoltaics are best known, and most commonly employed, as a method of generating electric power through the use of solar cells to convert solar energy into usable electric power.

Photovoltaic (PV) cells, commonly referred to as solar cells, use a variety of photovoltaic materials. Materials presently used include monocrystalline silicon, polycrystalline silicon, amorphous silicon, cadmium telluride, and copper indium gallium selenide (CIGS). Generally, CIGS cells are not limited to the use of copper, indium, gallium, and selenium, and can use semiconducting elements from Groups I, III, and VI of the periodic table because these elements exhibit high absorption coefficients and versatile optical and electrical characteristics, allowing devices made of such materials to be tuned and manipulated depending on the needs of the product.

Photovoltaic cells are very small products, fabricated by layering different chemicals on top of each other in very small amounts using different chemical. As such, the fabrication process is sequential, and must be performed very precisely for the cell to be effective. Photovoltaic materials are contained in an absorber layer, where light is absorbed and photons excite electrons in atoms of the photovoltaic material. This interaction moves the electrons from the valence band of the atom to the conduction band, wherein the electron is energized enough that it is free from binding with its atom and may move freely between atomic particles. Such delocalized electron movement provides electric current in metals and other conducting materials and may be harnessed as power. When the excited electron leaves its valence band, a "hole" is created in this valence band where an electron once was. This electron hole represents the absence of an object, and can be thought of as a negative object or a single positive charge which may also move between atoms as electrons move to fill holes in other atoms. The electron-hole pair and the relationship between the two objects is crucial to the function of photovoltaic cells.

A CIGS photovoltaic cells typically includes several layers of different materials to produce the desired solar-to-electrical energy conversion. Such a CIGS cell 101 is schematically shown in FIG. 1. The top layer of the cell 101 is an antireflection (AR) coating 111, which inhibits solar energy from being reflected off the cell surface and becoming unusable. Front contacts 110 (two of which are shown) are overlaid by the AR coating 111 and provide a negative terminal for electron flow in the cell 101. Below the contacts 110 and AR coating 111 is a transparent conducting oxide (TCO) layer ("window") 109 and a metal oxide buffer layer 108. Below this, a bottom buffer layer 107, possibly composed of an amorphous n-type material such as cadmium sulfide (CdS), zinc sulfide (ZnS) or tin sulfide (SnS) having a higher bandgap than the absorber layer 106, facilitates the travel of electrons to the contacts 110, as well as inhibits the reverse of this electron flow. Below the buffer layer 107 is a CIGS absorber layer 106, where the photovoltaic effect occurs and where electrons and holes are generated. The electrons move towards the front contacts 110, while the holes move through an ohmic junction 105 toward a back contact layer 104 formed of a conductive material, for example, molybdenum, tungsten, titanium, or copper. The back contact layer 104 may also reflect unabsorbed light back into the absorber layer 106. A pair of boundary layers 103 are represented as being disposed on opposite surfaces of what is generally referred to herein as a substrate 102 on which the other layers of the cell 101 are deposited. The boundary layers 103 inhibit the substrate 102 from becoming electrically charged and decreasing cell efficiency or even short-circuiting connections, as well as protects the substrate 102 from the environment. The substrate layer 102 provides the structural foundation for the cell 101, and is commonly composed of a glass material, though polyimide, metal foils, and other structural materials may be used to improve weight and flexibility.

The fabrication of CIGS cells typically begins with the substrate layer 102, and additional layers are deposited on top of each other through various chemical processes. The basic fabrication processes for CIGS cells are well known to those skilled in the art. However, many of these processes are inefficient and costly, or they may produce inferior cells in an attempt to improve process efficiency. It would be advantageous to provide a fabrication process for CIGS cells or cell components which produced higher-efficiency cells and cell components without a dramatic corresponding increase in fabrication cost.

BRIEF DESCRIPTION OF THE INVENTION

The present invention provides methods and semiconductor materials produced by such methods that are suitable for fabrication of and use in photovoltaic cells.

According to one aspect of the invention, a wet-chemical synthesis method is provided for producing a Group I-III-$VI_2$ semiconductor material. The method includes forming a solution containing an organic solvent, at least one Group I precursor consisting of at least one compound of at least one Group I element, and at least one Group III precursor consisting of at least one compound of at least one Group III element. The Group I precursor is present in the solution in an amount of less than 120% of a stoichiometric ratio of the at least one Group I element in the Group I-III-$VI_2$ semiconductor material, and the Group III precursor is present in the solution in an amount of greater than 55% of a stoichiometric ratio of the at least one Group III element in the Group I-III-$VI_2$ semiconductor material.

According to another aspect of the invention, a photovoltaic or opto-electronic device includes an absorber layer overlying a substrate layer. The absorber layer consists of semiconducting photo-absorptive nanocrystals of a Group Ib-IIIa-$VI_2$, a Group II-VI, a Group III-V, or a Group $I_2$-II-IV-$VI_4$ semiconducting p-type material and less than 10% by weight of one or more solvents.

A technical effect of the invention is the ability to provide photovoltaic cells, and solar panels composed of such cells, with attributes resulting from the aforementioned fabrication process, including higher efficiencies.

Other aspects and advantages of this invention will be better appreciated from the following detailed description.

DETAILED DESCRIPTION OF THE INVENTION

The following describes a fabrication process for CIGS photovoltaic cells, herein referred to simply as CIGS cells or PV cells, including the fabrication and deposition of components of such cells. The fabrication process includes multiple processing steps utilized in the fabrication, preparation, and deposition of these components, including substrate preparation, synthesis of CIGS nanoparticles, preparation of CIGS nanoparticles, substrate coating and pre-anneal, substrate thermal processing and selenization, buffer layer deposition, secondary buffer layer and TCO layer deposition, antireflective (AR) coating deposition, and front contact deposition. Exemplary aspects of these steps will be described in the order listed above. The fabrication process will make reference to the CIGS cell 101 represented in FIG. 1, though it should be understood that the invention is not limited to a CIGS photovoltaic cell having all of the features described for the cell 101.

Figure 1:
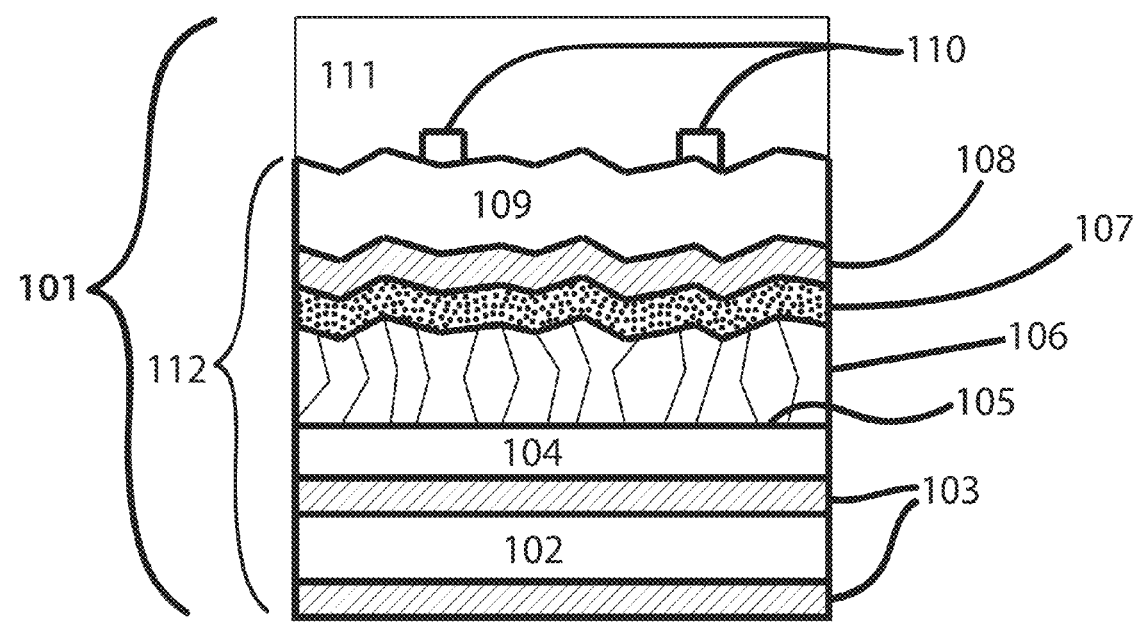
FIG. 1 schematically represents a cross-sectional view of a CIGS photovoltaic cell and schematically represented layers of the cell.

Substrate preparation begins with the acquisition of a suitable substrate material, preferably soda lime glass or metal foil, such that the substrate material is flexible and capable of being heated to subsequent processing temperatures without a detrimental effect on the integrity of the CIGS cells, for example, as a result of melting, breaking, deformation, or degradation. In a preferred embodiment, the substrate material is capable of withstanding temperatures of up to about 750° C. If not provided as such, the substrate material is shaped into a suitable form, possibly a roll or sheet, to yield a substrate 102 (FIG. 1). The substrate 102 is then cleaned, rinsed, and polished. If the substrate 102 is made of a conductive material, at least one boundary layer 103 of a dielectric or otherwise electrically-nonconducting material, such as silica, is preferably deposited on the substrate 102. The boundary layer 103 between the absorber layer 106 and substrate 102 of FIG. 1 serves as a barrier to inhibit electrons from moving from the absorber layer 106 to the substrate 102 when the final product is in use. Alternatively, and as described below as an optional aspect of the invention, the boundary layer 103 may be electrically conducting if flexible, cell-strung panels are desired as the end product. A back contact layer 104, preferably composed of molybdenum, is deposited on the substrate 102, (or boundary layer 103, if included). The deposition of both the back contact layer 104 and boundary layer 103 may be through vacuum deposition, such as physical vapor deposition (PVD) or splutter coating, or non-vacuum deposition, such as electroplating or photo-electroplating. Such methods are well known and practiced in the art.

Synthesis of CIGS nanoparticles (nanocrystals) is achieved through a chemical reaction within a solution containing at least one solvent and precursor compounds of elements desired for the semiconducting p-type material of the absorbing layer 106. The present invention encompasses various semiconducting p-type materials for the CIGS nanoparticles, including Group Ib-IIIa-VI$_2$, Group II-VI, Group III-V, and Group I$_2$-II-IV-VI$_4$ semiconducting p-type materials. The following particularly describes process steps for producing a Group I-III-VI$_2$ semiconductor material, in which case the Group I element is preferably copper, a first Group III element is preferably indium and/or zinc, a second Group III element is preferably gallium and/or tin, and a Group VI$_2$ element is a chalcogen, preferably elemental tellurium, selenium, and/or sulfur. Notable precursors for the Group I and III elements include halide, chalcogenide, nitrate, sulfate, citrate, acetate, and acetylacetonate compounds of these elements. The precursor compounds are added to a chemically inert reaction vessel in certain stoichiometric ratios which are believed to be contrary to conventional practice and provide unique attributes to the finished CIGS cell 101. In particular, the copper (Group I) precursor is present in the solution in an amount of less than 120% of a stoichiometric ratio for copper in the Group I-III-VI$_2$ semiconductor material, and each Group III precursor is present in the solution in an amount of greater than 55% of a stoichiometric ratio for its respective Group III element in the Group I-III-VI$_2$ semiconductor material. More preferably, the Group I (copper) precursor is present in the solution in an amount of less than 100% of the stoichiometric ratio for the Group I element in the Group I-III-VI$_2$ semiconductor material, a first Group III element (indium and/or zinc) is present in the solution in an amount of greater than 100% of the stoichiometric ratio of the first Group III element in the Group I-III-VI$_2$ semiconductor material, and a second Group III element (gallium and/or tin) is present in the solution in an amount of less than 110% of the stoichiometric ratio of the second Group III element in the Group I-III-VI$_2$ semiconductor material. As more particular examples, copper is preferably at about 80% and 96% of its stoichiometric value, unless the substrate 102 and/or back contact layer 104 are also copper, in which case a still lesser amount may be used in the solution. As other particular examples, indium is preferably at about 105% and 115% of its stoichiometric value in the solution, and gallium is preferably up to about 110% of its stoichiometric value in the solution. The solvent is added to the reaction vessel in an amount such that the concentration of the solutes is preferably less than 2.5 M. The solvent may be one or more of alkylamines, fatty acids, trioctylphosphines, or other suitable ligands. The reaction vessel is of a configuration such that it can be attached multiple hoses or lines, or otherwise such that vacuum, exhaust, and feed lines may all be attached to the reaction vessel simultaneously.

The reaction vessel is sealed, attached to a vacuum valve, an exhaust valve (closed at the beginning of the process), and a gas valve (closed at the beginning of the process), and heated to the boiling point of the solvent. Preferably, the pressure (vacuum) within the vessel is less than 40 Torr (about 0.05 bar), under which conditions the solvent boiling point is reduced, for example, to not more than 160° C. In one particular embodiment, oleylamine is used as a solvent and boils at approximately 135° C. under such vacuum conditions. The vessel preferably contains a gas that is inert to the ingredients therein. As such, suitable gases include noble gases, though the use of other gases (for example, nitrogen or carbon dioxide) is also foreseeable. The vessel is then heated while under vacuum until the solvent boiling point is reached and solvent boiling is observed. The boiling point temperature is maintained for a suitable amount of time, in one embodiment at least five minutes.

While the reaction vessel remains heated, the vessel is preferably degassed and purged of unwanted vapor or gaseous chemicals. Degassing is preferably achieved through a process that includes closing the vacuum valve and opening the gas valve to elevate the pressure within the vessel. The gas used to elevate the pressure can be the same as was previously in the vessel. When sufficient gas has been pumped into the reaction vessel, preferably greater than 60 Torr (about 0.08 bar) for at least two seconds as determined by the pressure within the reaction vessel, the exhaust valve is opened, allowing the reaction vessel to reach atmospheric pressure, and the gas flow is slowed and maintained for a period of time, in one embodiment at least ten seconds, then stopped. The gas and exhaust valves are again closed, and the vacuum valve is opened such that the vessel is again under vacuum for a period of time, in one embodiment at least two minutes. This process can be repeated until the vessel has been satisfactorily degassed and a reactant has formed. In one embodiment, the process is repeated three times.

Once the vessel has been suitably degassed, the vacuum is closed and the gas line opened to attain a relatively high flow rate. Once pressure is near atmospheric, the exhaust valve is opened and the vessel is heated to a reaction temperature, for example, a minimum of about 200° C. and more preferably at least 235° C. Once the reaction temperature is reached, a sulfur solution is added to the contents of the reaction vessel to form a product solution. The sulfur solution is introduced into the reaction vessel at a temperature below the temperature of the reactant and without opening the vessel, for example, by injection through a stopper. A minimum stoichiometric ratio of sulfur to the other reactants in the Group I-III-VI$_2$ semiconductor material is added, and excess sulfur is preferred. As a particular example, the sulfur solution may contain sufficient elemental sulfur dissolved in a solvent to achieve a sulfur concentration of about 1 M to about 4 M, and the sulfur solution introduces sulfur into the reaction vessel at least 80% of stoichiometry for sulfur in the Group I-III-VI$_2$ semiconductor material. The reaction temperature is maintained until the reactants have combined to form CIGS nanoparticles in a CIGS solution, determined through visual observation or other methods. In one embodiment, the reaction temperature is maintained for four minutes. Once the CIGS solution has cooled, for example, to about 65° C., the solution may be exposed to air, removed from the reaction vessel, and prepared for the next process.

Nanoparticle preparation, or "washing," begins, in one embodiment, by putting the synthesized CIGS solution into one or more centrifuge tubes. Solvent and anti-solvent chemicals are added to the tubes to remove supernatants and any remaining original reactants and solvents. Solvents may include toluene and hexane, and anti-solvents may include methanol, ethanol, and isopropanol. The CIGS solution should occupy less than the entire volume of the centrifuge tube, preferably not more than 35% of its volume. The solvent and anti-solvent chemicals are preferably added in an approximately 3:1 ratio of chemical to CIGS solution. Other possible embodiments for nanoparticle preparation include continuous-flow centrifugation and nano-filtration methods, where the above described washing solvents and/or anti-solvents may be replaced or removed altogether.

The CIGS solution is washed by placing the mixtures in a centrifuge for a period of time, removing the solvent and anti-solvent chemicals along with the collected supernatants, and redissolving the CIGS solution into solvent and anti-solvent chemicals before being placed in the centrifuge again. The process is preferably repeated until the supernatants constitute a small amount of the remaining solution. Tuolene, or whichever solvent is used, is preferably added to the tube in decreasing volumes, at most one-third of the centrifuge tube volume, in subsequent washing cycles. In one embodiment, the washing process is repeated three times, and the remaining supernatant was less than 5% of the mass of the remaining solution.

Once the washing cycle is complete, the CIGS nanoparticle solution is removed from the centrifuge tube to the processing tube and allowed to dry. As a result of the washing cycle, the resulting dry precipitate of nanoparticles preferably contains less than 20% by weight of any of the solvents employed in the process thus far. Once dry, the mass of the nanoparticles is recorded and an "ink" solvent is added thereto in a suitable processing tube. The ink solvent is added in amount dependant on the amount of nanoparticle present. In one embodiment, hexanethiol is used as the ink solvent, and is added to the nanoparticle solution in a ratio of about 1 mL Hexanethiol to about 50 mg nanoparticles. In another embodiment, a ratio of about 1 mL Hexanethiol to about 200 mg nanoparticles was employed. The processing tube is then sealed and placed on a vortexer or another appropriate agitation device for a period of time, followed by an ultrasonicator bath until the mixture is mixed so that it forms an ink suitable for application as a coating. As nonlimiting examples, the mixture may be placed on a vortexer for about one to two minutes, followed by an ultrasonicator bath for about twenty to about thirty minutes.

Substrate coating and pre-anneal is a step that entails applying the ink to the substrate 102 (including the boundary layer 103 and back contact 104) to form the absorber layer 106 comprising the CIGS nanoparticles. The assembled substrate 102, boundary layer 103, and back contact 104 are preferably cleaned and rinsed to remove surface debris and impurities, then preferably dipped in a solution in a salting bath. The cleaning and salting bath may use ultra-purified deionized water (UP $diH_2O$). The solution may include, for example, sodium halide, sulfate, nitrate, periodate, parapersiodate, acetate, or benzoate. After bathing, the substrate is dried, for example, with hot rollers or other heating equipment, preferably at a temperature of less than 400° C. and for a period of less than 45 minutes.

Figure 2:
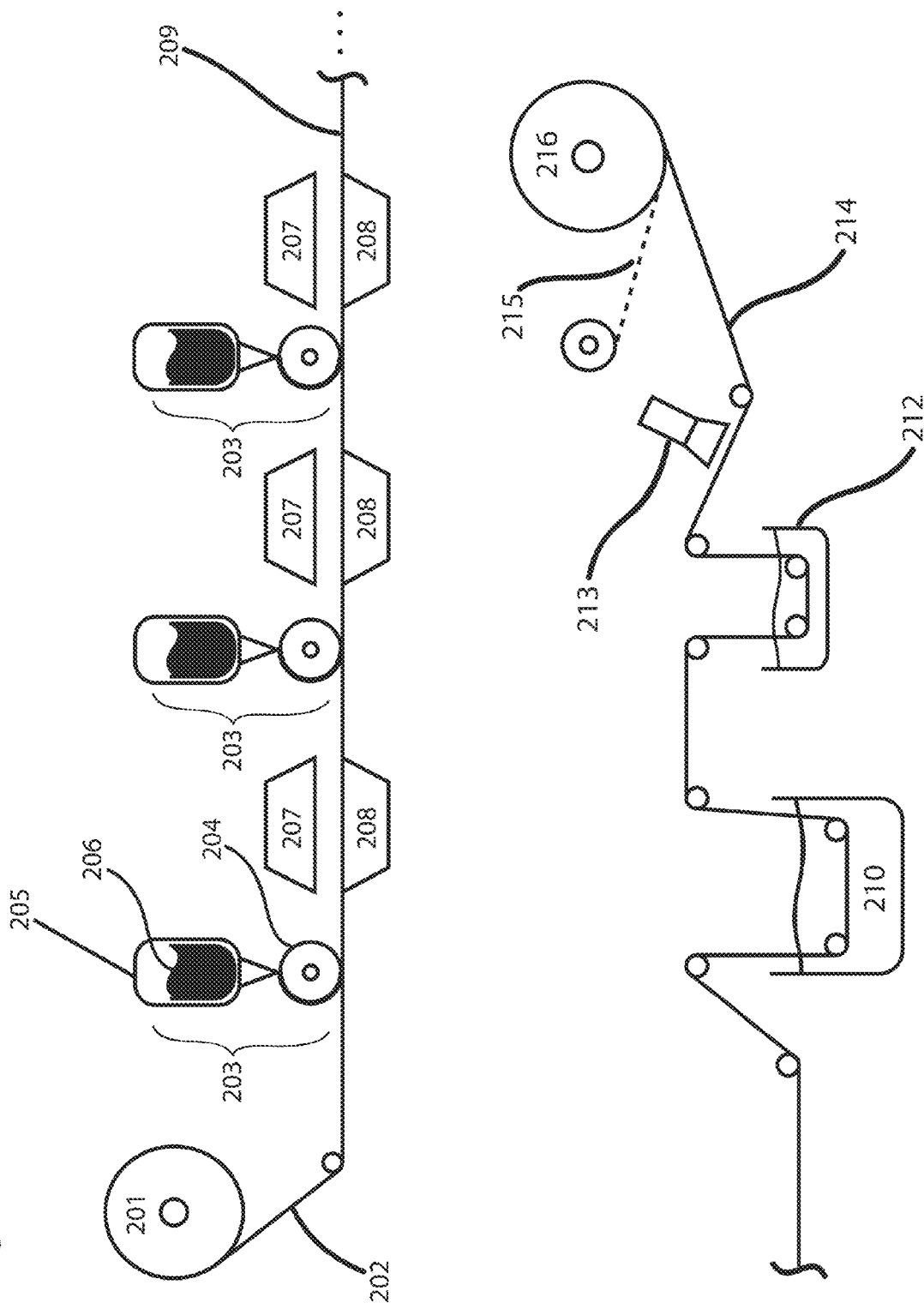
FIG. 2 is a diagram illustrating deposition, anneal, and etch steps preferably utilized in the fabrication of a CIGS absorber layer for a CIGS photovoltaic cell, such as that of FIG. 1, in accordance with a nonlimiting embodiment of the invention.

FIG. 2 illustrates a possible embodiment of the process for substrate coating with the ink. A substrate structure 202 (comprising at least the substrate 102) is released from an input coil 201. Nanoparticle ink 206 contained in an ink container 205 is deposited onto a rolling head 204, which contacts the substrate 202 and rolls and presses the ink 206 onto the substrate 202. The ink container 205, nanoparticle ink 206, and rolling head 204 constitute an ink assembly 203. The substrate 202 and ink 206 are then dried by heating elements 207 and 208. The substrate 202 can be repeatedly recoated and redried by successive ink assemblies 203 and heating elements 207 and 208 until a nanoparticle layer is applied to attain a desired thickness. Preferably, two to five coatings may be deposited to attain a nanoparticle layer of about 0.2 and about 10 µm in thickness. It should be noted that the ink 206 required to adequately coat the substrate 202 depends on the surface area of substrate 202 being coated, and that the nanoparticle synthesis and nanoparticle preparation processes described previously may need to be repeated, or performed in sufficient volume to adequately coat a desired sample of the substrate 202.

The resulting ink-coated substrate 209 may be passed through an etching and washing process. The etching bath 210 may consist of sodium or potassium cyanide in UP $diH_2O$. Preferably, the ink-coated substrate 209 is in an etching bath 210 for up to about two minutes. A rinsing bath 212 may include an agitate bath of UP $diH_2O$ and a cyanide monitoring/flushing system. The etched ink coated substrate 209, hereafter referred to as an etched substrate structure 214, is then air dried 213. The etched substrate structure 214 may be mated with a protective interleaf 215 before it is placed in storage spool 216, either stacked or coiled, to be ready for the next step in the cell fabrication process. The specific elements of this process may be changed to accommodate various production and chemical factors, so long as the ink is deposited on the substrate in a manner without removing all of the solvent.

Figure 3:
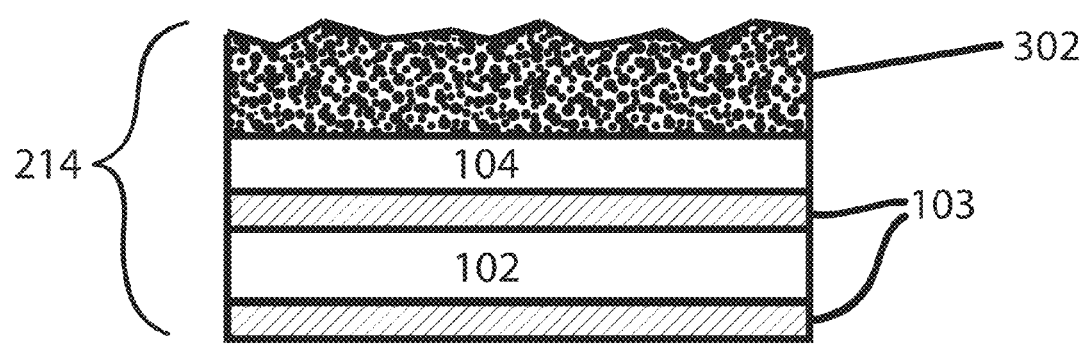
FIG. 3 schematically represents a cross-sectional view of an etched substrate produced by the substrate coating and pre-anneal process of FIG. 2.

FIG. 3 illustrates a product fabricated as a result of the processes described so far. After substrate coating and pre-anneal, the etched substrate structure 214 now includes the substrate 102, boundary layers 103, back contact 104, and a nanoparticle layer 302.

Figure 4:
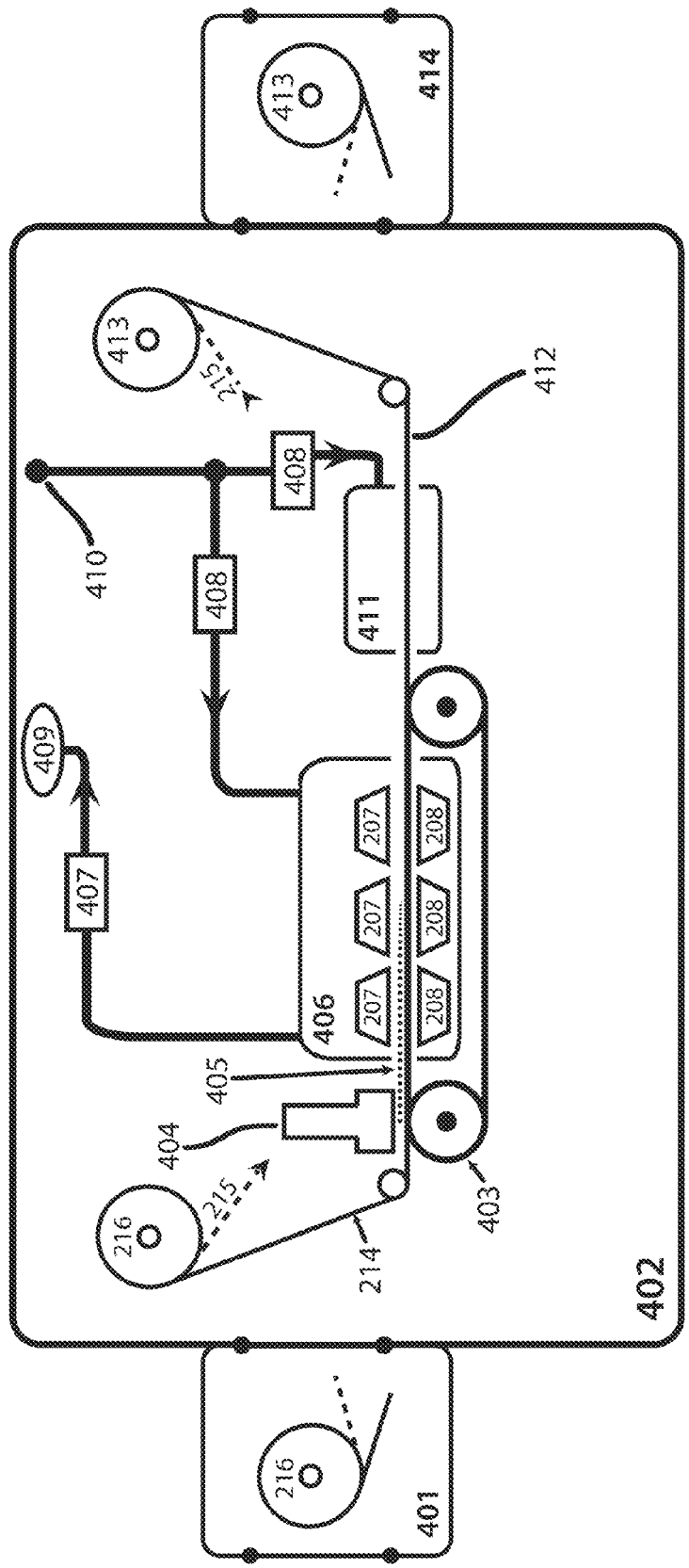
FIG. 4 is a diagram illustrating a substrate thermal processing step and selenization step performed on the substrate of FIG. 3 in accordance with a nonlimiting embodiment of the invention.

The following description will be directed to the use of selenium as a Group $VI_2$ chalcogen for the Group $I$-$III$-$VI_2$ semiconductor material, utilizing a selenization step to yield a CIGS/Se material, though it should be understood that the invention is not so limited. Substrate thermal processing and selenization alters the nanoparticle layer 302 on the substrate structure 214 to yield an absorber layer 106 composed of large, densely-packed grains of CIGS/Se crystals, with each nanocrystal preferably having a height that is greater than 2% of the thickness of the absorber layer 106. FIG. 4 illustrates such a process, by which the substrate structure 214 is dispensed from a storage spool 216 within an input evacuation chamber 401. The substrate structure 214 is purged and degassed by placing the chamber 401 under vacuum and then refilling the chamber 401 with a gas, similar to the reaction vessel purge process described previously. Similarly, the vacuum preferably has a pressure of 40 Torr (about 0.05 bar) or less, while the gas is preferably applied at a pressure of about 0.5 to about 5 bar. Purging and degasssing may be repeated two to five times, or until the chamber 401 is suitably purified.

The etched substrate structure 214 is released from the storage spool 216 and unmated with the protective interleaf 215 after being moved to a main process chamber 402 without being exposed to outside air. The main process chamber 402 is filled with an inert gas, preferably at a pressure of about 0.1 to about 10 bar to prevent dramatic changes in chemical behavior. The substrate structure 214 is then mated to a conveyor belt 403, and an automated dispenser 404 deposits secondary chalcogen 405 (in the present example, selenium, alternatively or additionally tellurium and/or sulfur) at a controlled rate onto the etched substrate structure 214. Preferably, the chalcogen 405 is deposited at a rate of about 20 g to about 200 g per square meter of substrate structure 214. Suitable forms of the chalcogen 405 include a vapor of the elemental chalcogen and/or one or more gaseous compounds of the chalcogen.

The conveyor belt 403 carries the substrate structure 214 and secondary chalcogen 405 into a selenization process chamber 406, which is insulated by a nonreactive substance such as quartz or sapphire. Heating elements 207 and 208 may be provided inside the chamber 406, which is connected to both an exhaust gas vent 409 that can be controlled through an exhaust gas valve 407 or flow controller, and to a gas input 410 controlled through a gas flow controller 408. The gas input 410 provides a flow of gas (for example, a noble gas, nitrogen, carbon dioxide, etc.) at a controlled rate and pressure to the chamber 406, for example, a pressure of greater than 0.05 bar. The heating elements 207 and 208 heat the substrate structure 214 with the secondary chalcogen 405 and mated conveyor belt 403 for a period of time until the selenization process is complete, such that the nanoparticle layer 302 on the substrate structure 214 has been converted to form an absorber layer 106 composed of large, densely-packed grains of CIGS/Se crystals. This process may be carried out for about four to about thirty minutes at a temperature of about 300 to about 800° C.

After selenization, the resulting CIGS/Se-coated substrate structure 412 is unmated from the conveyor belt 403 and enters a cooling chamber 411 where the gas flow controller 408 provides a high flow of gas to cool the substrate structure 412. In one embodiment, the substrate structure 412 may be cooled to a temperature of about 120° C. The substrate structure 412 is preferably again mated to a protective interleaf 215 for storage, for example, on a storage coil 413, which is removed form the selenization process through an exit chamber 414. The process has been described in terms of a certain embodiment, and details such as the temperatures, pressures, and durations of elements of the process, as well as the machinery or mechanical elements required to accomplish, may change depending on the exact chemical compositions of the substrate structure 214 and chalcogen 405 and the volume being produced.

Figure 5:
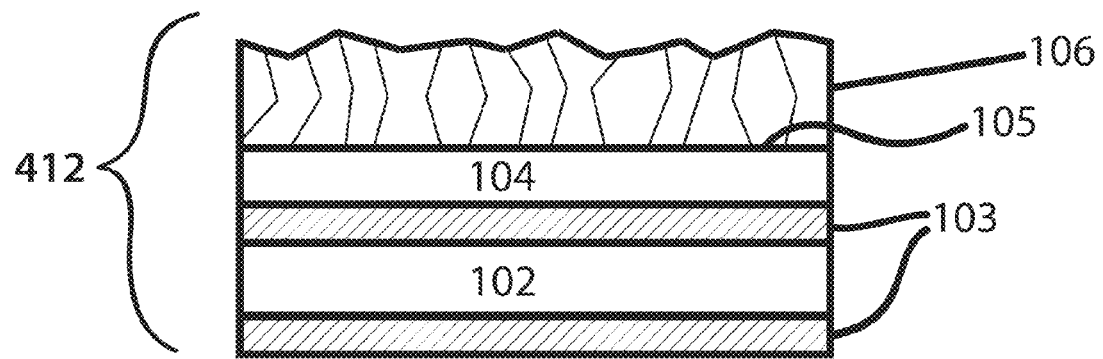
FIG. 5 schematically represents a cross-sectional view of the substrate of FIG. 3 following the selenization step of FIG. 4.

FIG. 5 represents the CIGS/Se-coated substrate structure 412, including the substrate 102, boundary layer 103, back contact 104, and CIGS/Se coating which forms the absorber layer 106, as well as an ohmic junction 105 defined by and between the back contact 104 and absorber layer 106. It is preferable, and a result of this process, that the surface of the absorber layer 106 is uneven, for example, ridged or rough and otherwise not smooth, as it improves solar energy absorption in the finished PV cell 101.

Figure 6:
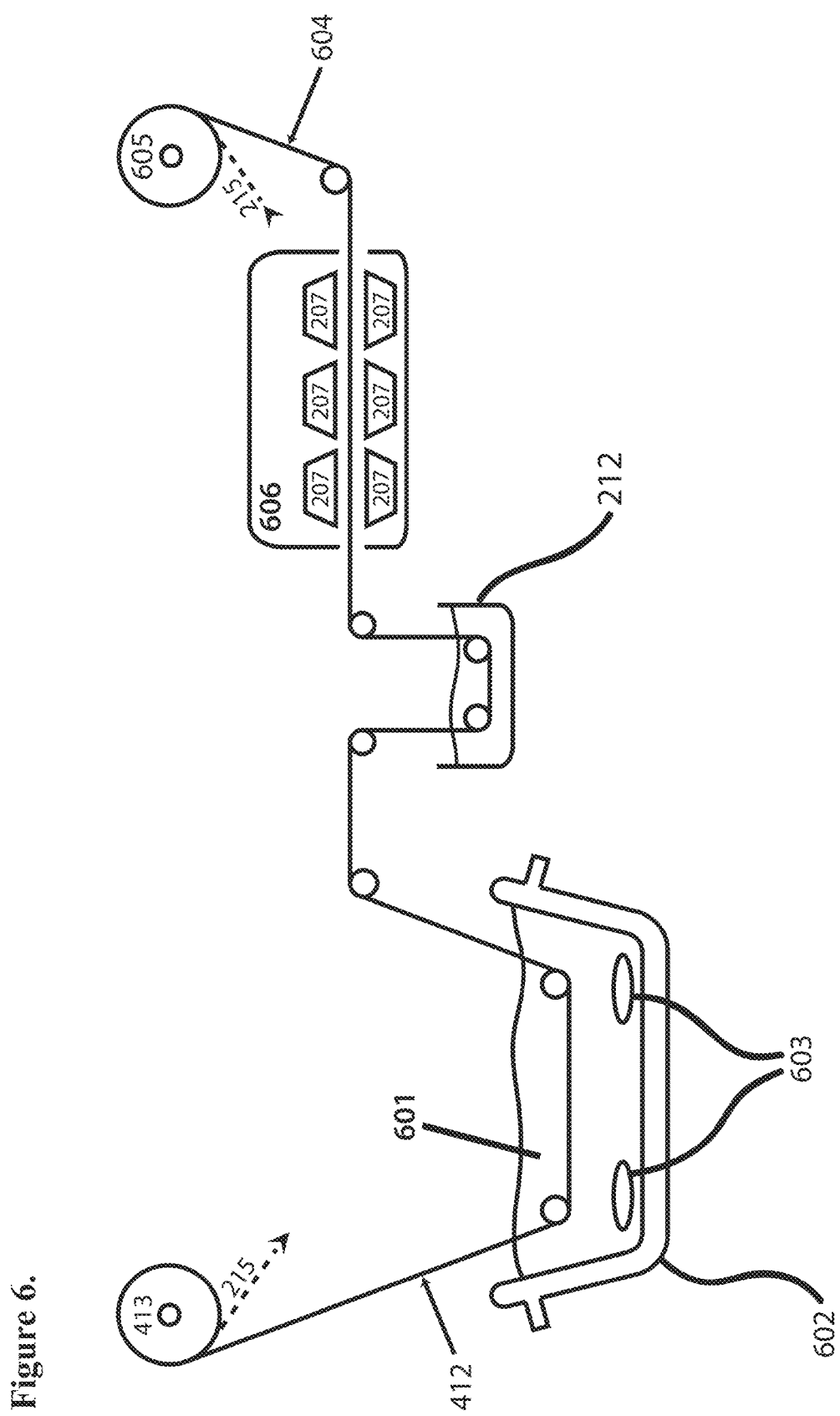
FIG. 6 is a diagram showing a buffer layer deposition process performed on the substrate of FIG. 5 in accordance with a nonlimiting embodiment of the invention.

Buffer layer deposition is an optional process that preferably occurs after the substrate structure 214 has been coated with CIGS/Se coating to yield the substrate structure 412 of FIG. 5. FIG. 6 illustrates one particular embodiment of a buffer layer deposition process in which the substrate structure 412 is uncoiled from the input coil 413 and unmated from the protective interleaf 215. The substrate structure 412 is then moved to a chemical bath 601 contained within a heated- controlled waterbath 602 preferably equipped with stirring rods 603 or other agitation devices to evenly maintain a desired temperature in the bath 601 without heating or disturbing the bath 601 directly. In embodiments in which the buffer layer (107 in FIG. 1) is an amorphous n-type material of cadmium and/or zinc sulfide, the chemical bath 601 may include a solution of UP $diH_2O$, aqueous cadmium and/or zinc ion source, and an aqueous base. Preferred cadmium and zinc ion sources include a sulfate, halide, or nitrate, and the aqueous base is ammonia and added in such amount that the pH of the bath 601 is about 10 to about 13.

The waterbath 602 is heated until the chemical bath 601 within reaches a target temperature, preferably about 55° C. to about 75° C. A sulfur source is preferably added to the bath 601, preferably a thiourea solution in UP $diH_2O$. After the chemical bath 601 with added sulfur solution reaches the target temperature, the substrate structure 412 is submerged in the bath 601, preferably for a duration about five to about twenty minutes. The substrate structure 412 is then removed from the chemical bath 601 and conveyed to a rinsing bath 212 which, similar to the previously-noted rinsing bath 212 of FIG. 2, may include agitated UP $diH_2O$. The substrate structure 412 is then dried by being moved through an air-anneal tunnel furnace 606 with heating elements 207 and 208, which preferably heat the substrate to a temperature of about 100° C. to about 150° C. for a duration of about ten to about twenty minutes. After drying, the resulting substrate structure 604, with the buffer layer 107 thereon, is mated with a protective interleaf 215 and respooled or restacked in a storage coil 605.

Figure 7:
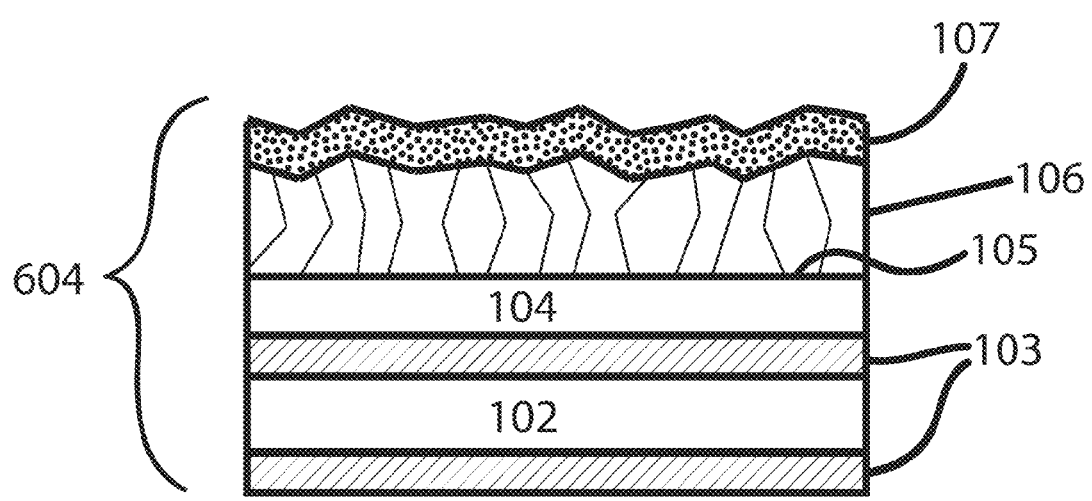
FIG. 7 schematically represents a cross-sectional view of the substrate of FIG. 5 following the deposition step of FIG. 6.

FIG. 7 illustrates a cross-section of the buffer-coated substrate structure 604, showing the substrate 102, boundary layers 103, back contact 104, junction layer 105, absorber layer 106, and buffer layer 107.

Following the buffer layer deposition, a secondary buffer and TCO deposition process preferably occurs, which provides the buffer-coated substrate structure 604 with a secondary buffer layer 108 and TCO ("window") layer 109. The secondary buffer and TCO deposition processes may be similar and carried out by various alternative methods. For example, the buffer and TCO layer layers 108 and 109 may be deposited using traditional sputter deposition under vacuum, or using photo-electrochemical methods. While electrochemical methods are used less frequently than sputter deposition, both methods are well known in the art. Photo- electrochemical deposition is an alteration of electrochemical methods well known in the arts, such that illumination from an external light source, preferably with an intensity greater than five lumens and at a frequency equal to or greater than that of the bandgap of the absorber layer 106, provides a reverse-bias voltage and photo-generated current needed to precipitate and coat the substrate structure 604 with the buffer layer 108 and TCO layer 109, using the same or similar solutions.

Figure 9:
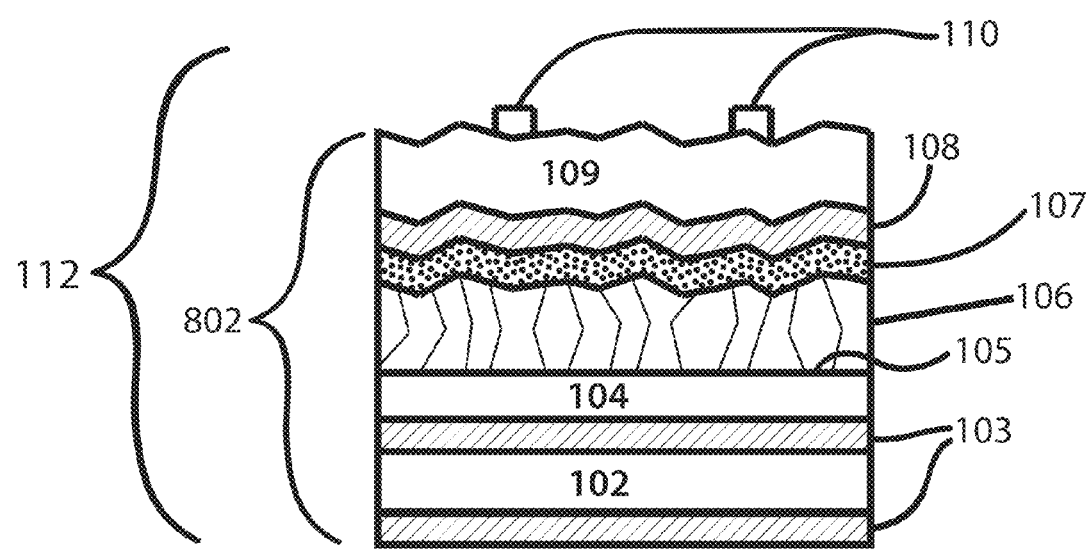
FIG. 9 schematically represents a cross-sectional view of the substrate of FIG. 7 following the deposition step of FIG. 8.

FIG. 9 illustrates a cross-section showing the substrate 102, boundary layers 103, back contact 104, junction layer 105, absorber layer 106, buffer layers 107 and 108, and TCP layer 109. The secondary buffer layer 108 preferably provides a secondary protection against back current from the absorber layer 106. As previously noted, the secondary buffer layer 108 may be a thin film of metal oxide, commonly intrinsic (undoped) zinc oxide (IZO), though the use of other TCO materials is foreseeable. The TCO layer 109 collects the photogenerated electrons ejected from the absorber layer 106, and must be transparent to light but also conductive to electricity. Suitable materials for the TCO layer 109 include, but are not limited to, indium-doped tin oxide (ITO) and aluminum-doped zinc oxide (AZO).

Antireflective (AR) coating deposition provides an antireflective (AR) coating 111 (FIG. 1), which prevents or at least inhibits the reflection of solar energy light incident on the CIGS cell 101. Typically, the AR coating 111 is about 100 nm to about 150 nm thick, and is deposited using chemical vapor deposition (CVD). In one embodiment, this coating 111 may be omitted in favor of an anti-reflective front laminate 1102 (FIG. 11) used as the top sealant layer for a flexible, ribbon-strung PV panel 1015 (FIG. 10).

Figure 8:
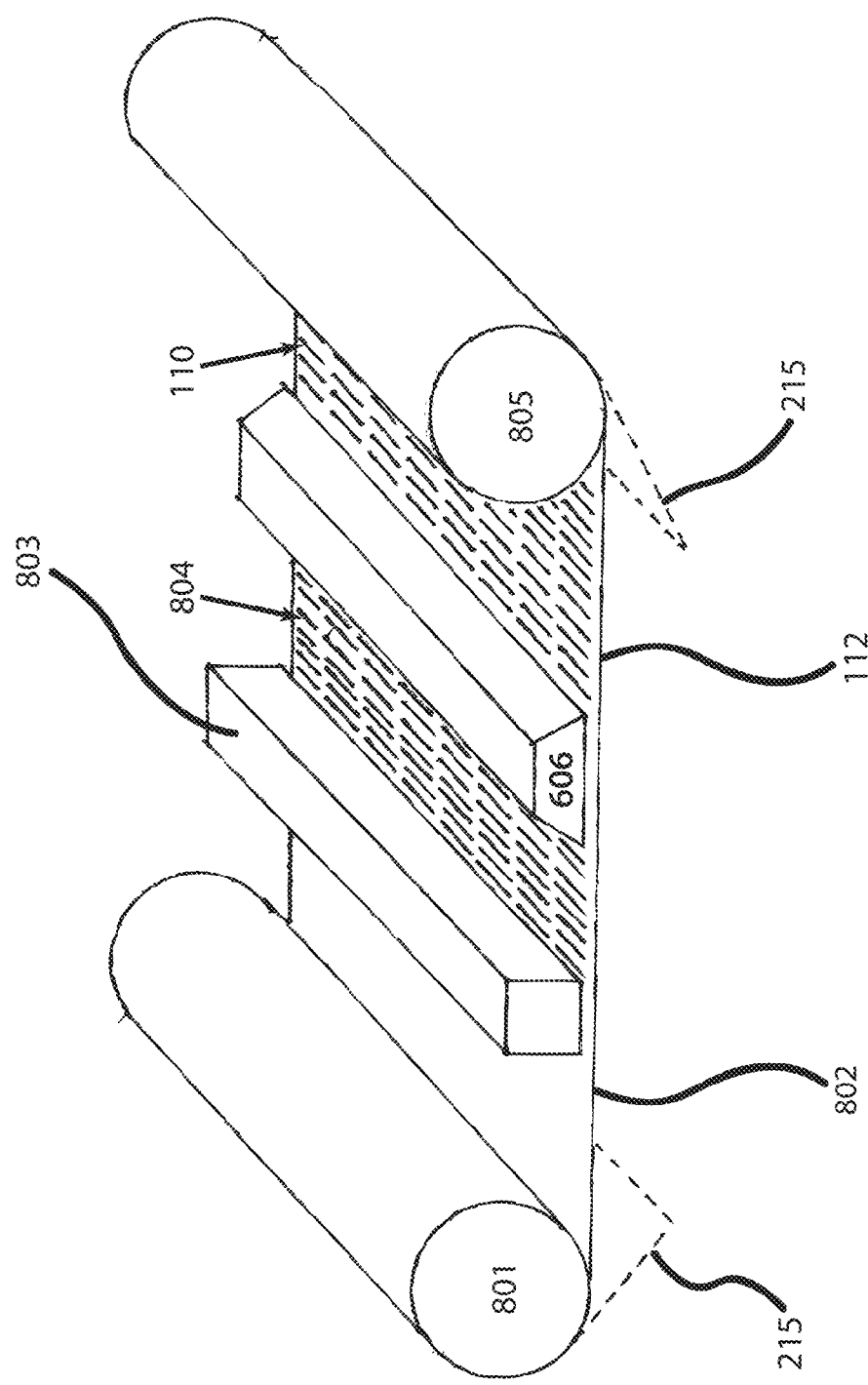
FIG. 8 is a diagram showing a front contact deposition process performed on the substrate of FIG. 7 in accordance with a nonlimiting embodiment of the invention.

Front contact deposition creates a grid of front contacts 110 of the solar cell 101, which serve as the negative terminal to which photogenerated electrons flow. As such, the front contacts 110 are where electric current is collected and where power connections are soldered or contacted. Front contact deposition can be achieved through a variety of methods, many of which are well known to those skilled in the art. One particular embodiment of such a method is shown in FIG. 8, and is included for its relevance to the preceding processes and the finished product. FIG. 8 represents a substrate structure 802 produced to have both buffer layers 107 and 108 and a TCO layer 109. The substrate structure 802 is unstacked or uncoiled from an input coil 801, and unmated from a protective interleaf 215. Metallic paste or ink of colloidal silver, aluminum, or other conductive metals is placed in an ink bin of an inkjet 803 or other similar device. The paste/ink is then printed onto the substrate structure 802. Optimally, the paste/ink is printed in thin, parallel lines 804 to reduce obstruction of light particles, however this configuration is optional. The substrate structure 802 may then be air-annealed 606 at a temperature of about 50 to about 250° C. for a period of ten minutes or less to form the front contacts 110 of the cell 101. The resulting substrate structure can be mated with a protective interleaf 215 and respooled or restacked in a storage coil 805. FIG. 9 is a cross-sectional representation of a substrate structure 112 after front contact 110 deposition. Subsequent application of the AR coating 111 yields the embodiment depicted in FIG. 1.

The previous processes describe the fabrication of a solar cell 101 using wet-chemical synthesis of an absorber layer 106. Additional processes are required to produce a solar panel using photovoltaic cells fabricated in the preceding processes. These processes are well known to those skilled in the art, but one such embodiment is included for its relevance to the preceding processes and the finished product.

Figure 10:
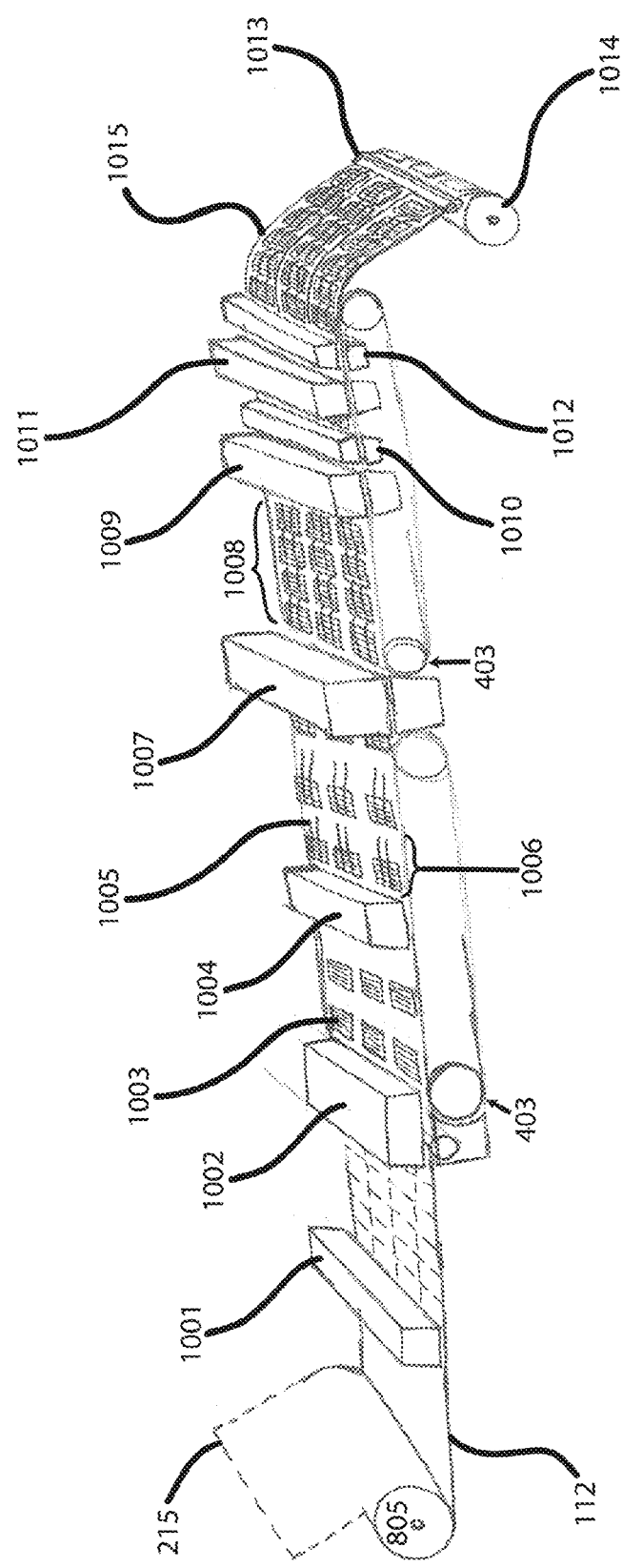
FIG. 10 is a diagram illustrating a process to produce solar panels composed of solar cells of a type represented in FIG. 1 and produced utilizing the substrates and process steps of FIGS. 2 through 9 in accordance with a nonlimiting embodiment of the invention.

FIG. 10 illustrates a nonlimiting process of assembling panels from the storage coil 805 following the front contact deposition process. The coil 805 is unspoiled and the protective interleaf 215 removed, after which the substrate structure 112 passes through a laser etching apparatus 1001. After laser etching, the substrate structure 112 is mated to a first conveyor belt 403, after which it goes through a dicing apparatus 1002, which turns the substrate structure 112 into uniform square PV cells 1003. These cells are carried on the first conveyor belt 403 to a ribbon depositing and soldering apparatus 1004, which deposits and solders conductive ribbons 1005 onto the cells 1003 to assemble ribbon-connected cells 1006. Following this, the end of the ribbon 1005 is soldered to the back of the previous ribbon-connected cell 1006 in a back soldering machine 1007, producing ribbon cell strings 1008. These ribbon cell strings 1008 then pass through a wire laying, stringing, and soldering apparatus 1009, which cut the ribbon cell strings 1008 to desired length and lay and solder/spot weld string interconnecting wires 1806 and string interconnecting bars 1805 to the cell strings 1008. These interconnected strings then pass through a bus plate connecting and welding apparatus 1010, which connects the ending conductive ribbons 1005 to panel bus bars 1804 and 1807 and panel electrodes 1801 and 1809, as well as solders the bus wires 1803 and 1810 between the bus bars 1804 and 1807 and panel electrodes 1801 and 1809. These assembled "bare panels" are then passed through a roll lamination machine 1011, followed by a panel interconnect attachment apparatus 1012, which attaches a click-locking panel interconnect 1013 to the laminated, flexible panel roll 1015, which is then coiled 1014 and stored.

Figure 11:
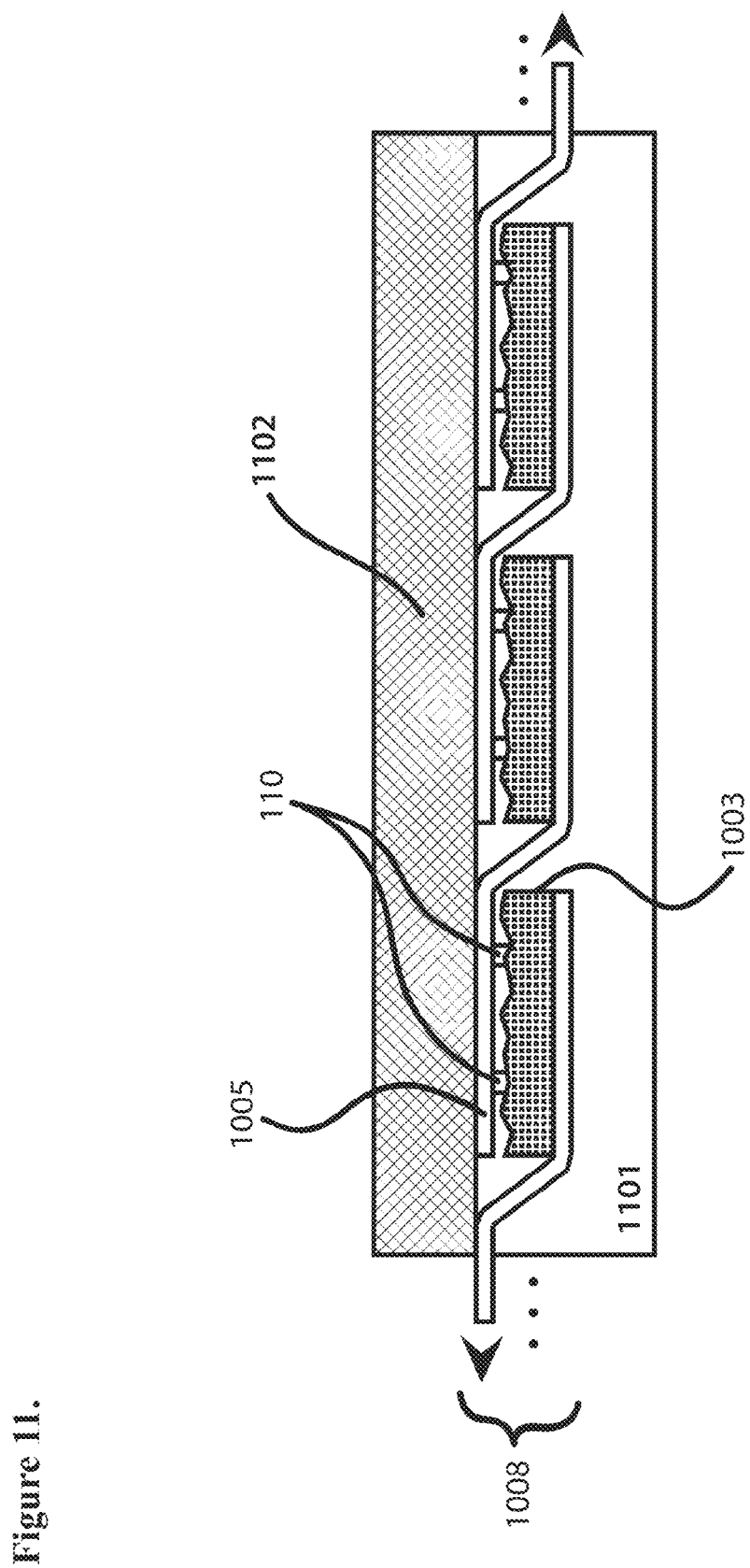
FIG. 11 schematically represents a cross-sectional view of a solar panel produced by the process illustrated in FIG. 10 in accordance with a nonlimiting embodiment of the invention.

FIG. 11 represents a cross-section of a solar panel produced by the process depicted in FIG. 10. The ribbon cell string 1008 is shown between a bottom laminating film 1101 and a top laminating film 1102. The bottom laminating film 1101 is preferably thermally conductive and electrically insulating and has a high tensile strength, while the top laminating film 1102 is preferably transparent and anti-reflective.

Figure 12:
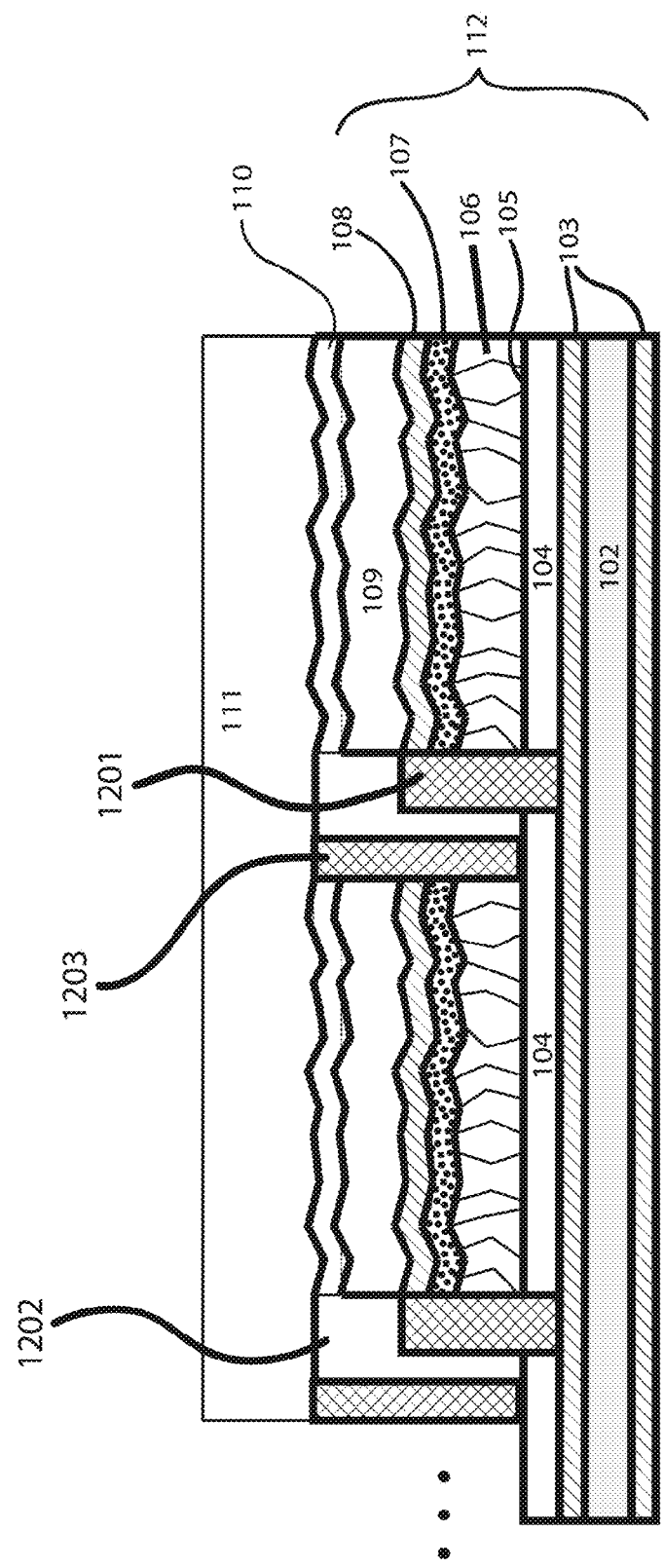
FIG. 12 schematically represents a cross-sectional view of a monolithic solar panel, wherein the substrate and boundary layers are continuous across the entire assembly in accordance with a nonlimiting embodiment of the invention.

FIG. 12 represents a cross-section of a monolithic panel, wherein the substrate 102 and boundary layers 103 are continuous across the entire assembly. Transparent insulators 1201 and 1203 insulate a conductive interconnect 1202, which connects the TCO layer 109 and/or front contact 110 of one cell to the back contact 104 of an adjacent cell.

Figure 13:
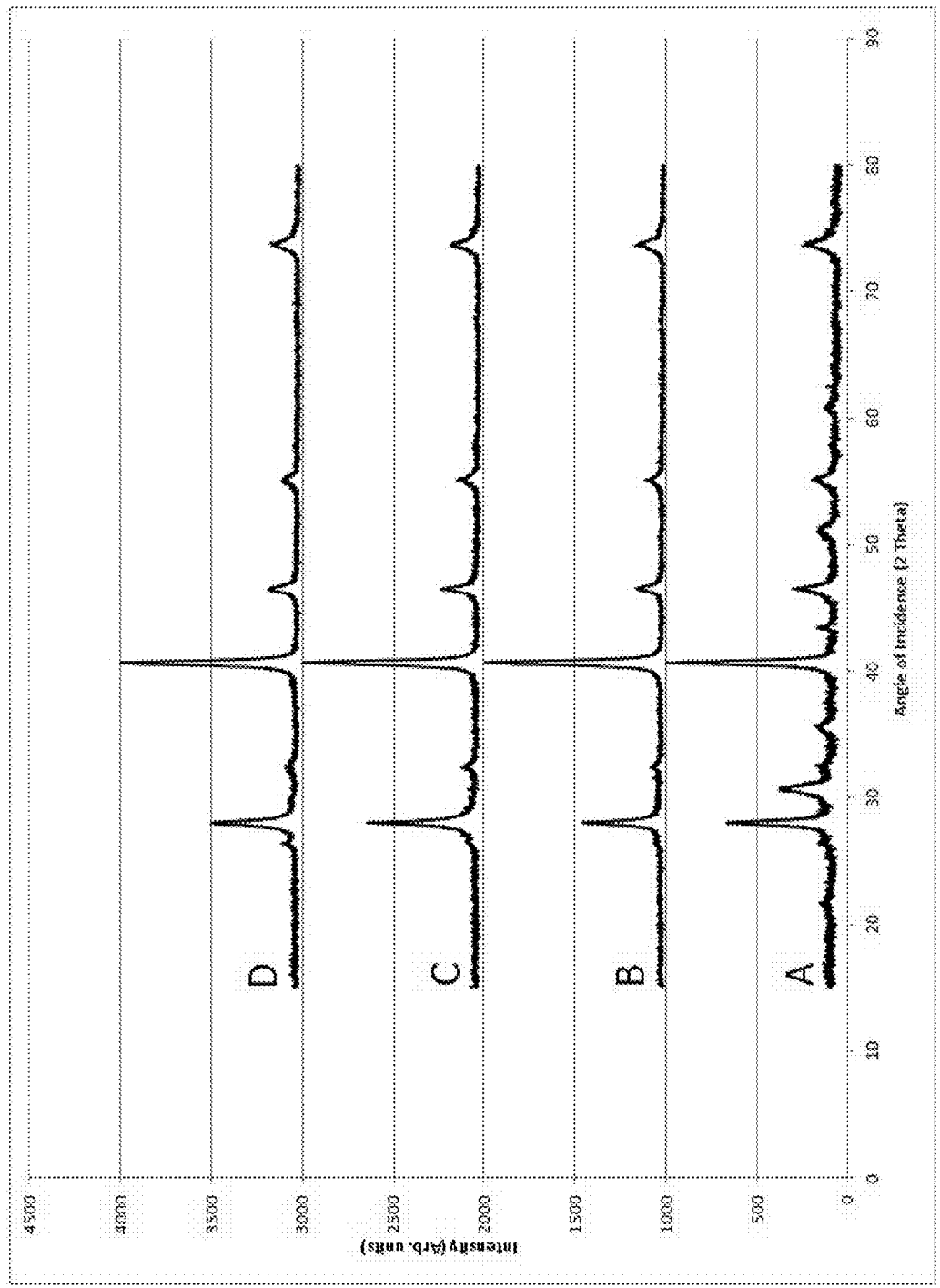
FIG. 13 is an X-ray diffraction plot illustrating structural and compositional differences in nanoparticles depending on variations in precursor sulfur concentration.

FIG. 13 is an X-ray diffraction plot evidencing effects of structural differences in the nanoparticles depending on variations in precursor sulfur concentration. Plot A relates to a sulfur concentration of 50% less than the stoichiometric ratio in a Group I-III-VI$_2$ semiconductor material produced by the process described above. Plot B relates to a sulfur concentration at the stoichiometric ratio, Plot C relates to a 50% stoichiometric excess of sulfur, and Plot D relates to a 100% stoichiometric excess of sulfur. It can be seen from the angles of 2 Theta corresponding to between 26 degrees and 35 degrees that Plot C shows the nanoparticles of preferred composition and chalcopyrite structure. This composition is preferred for use over sphalerite and/or lower-purity nanoparticles, such as those of Plot A.

The above description discloses a photovoltaic panel comprising cells produced using wet-chemical synthesis of absorber layers 106. FIGS. 14 through 18 depict such components of panels. Although the construction of solar panels is well known to those skilled in the art, the construction of solar panels using the aforementioned cells will largely adhere to conventional construction methods.

Figure 14:
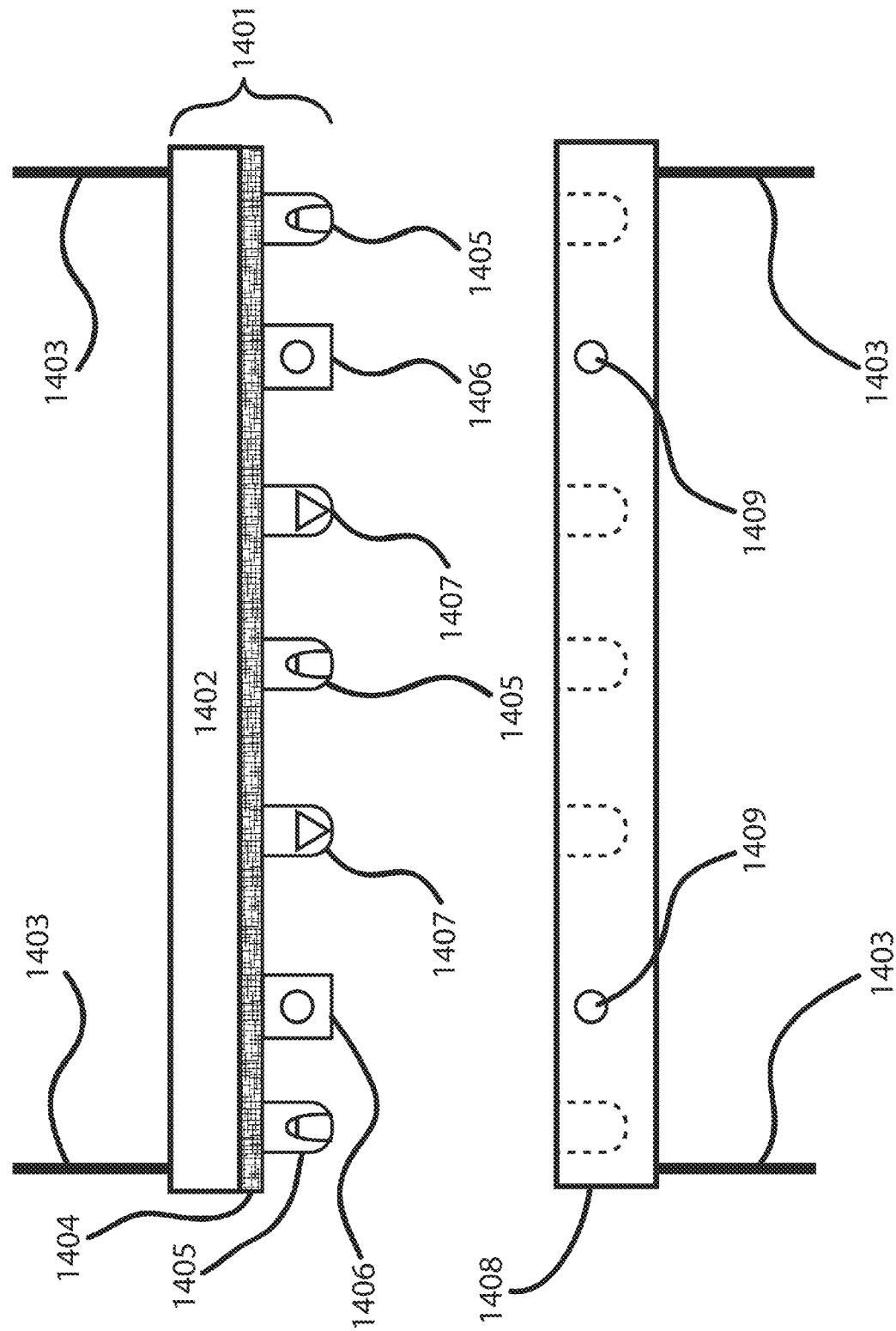
FIG. 14 schematically represents a plan view of connecting ends of assembled flexible PV panels in accordance with a nonlimiting embodiment of the invention.

FIG. 14 illustrates connecting ends of assembled flexible PV panels, and provides a top view of the connecting ends. This diagram shows the presence of three click-locking structural connectors 1405, attached to a male panel interconnect 1401. In one embodiment, these connectors 1405 are symmetrically placed along the interconnect 1401, although in alternate embodiments they may be placed asymmetrically. The interconnect 1401 may include an outer casing 1402 attached to a non-electrified structural wire 1403 and a sealing ring 1404. Additional components are as follows: a female (top) connector 1408; a plastic connector securing attachments (including a structural wire 1403) to the laminated cell area 1015; male structural socket connectors 1406 arranged asymmetrically to prevent incorrect installation; a female structural socket connector 1409 placed such that holes in the connector 1409 are aligned with holes in the connectors 1406 of the interconnect 1401 when properly connected; and water-resistant or waterproof electrical connectors 1407.

Figure 15:
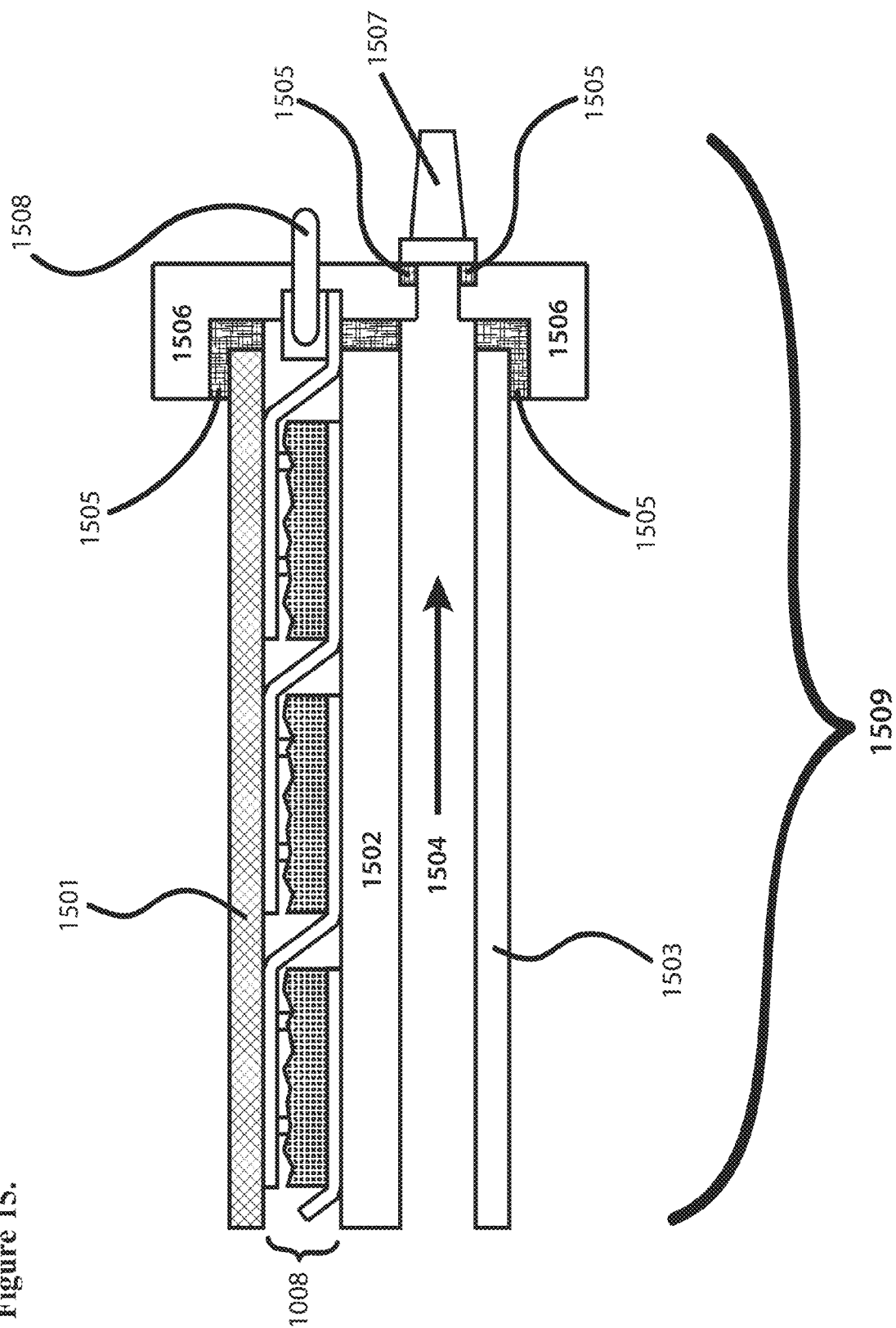
FIG. 15 schematically represents bottom-side connections of combined heat and electricity panels in accordance with a nonlimiting embodiment of the invention.

FIG. 15 illustrates the bottom-side connections of combined heat and electricity panels, which are symmetrical for the right-side connection and mating for the top connection. The side view of the bottom connection depicts the following components: a front pane 1501, optimally anti-reflective as well as electrically and thermally insulating; a water-resistant or waterproof electrical connector 1508; interconnected and wired PV cells 1008, as a "Bare Panel"; a heat exchange pane 1502 preferably electrically insulating and thermally conductive; and a self-locking coolant valve 1507; a coolant flow layer 1504 (direction of flow shown as example only); a waterproof sealant 1505 placed between a panel end bracket 1506 and the coolant valve 1507; a back pane 1503, optimally thermally insulating, does not have to be electrically insulating or transparent; and a combined heat/electricity PV panel 1509.

Figure 16:
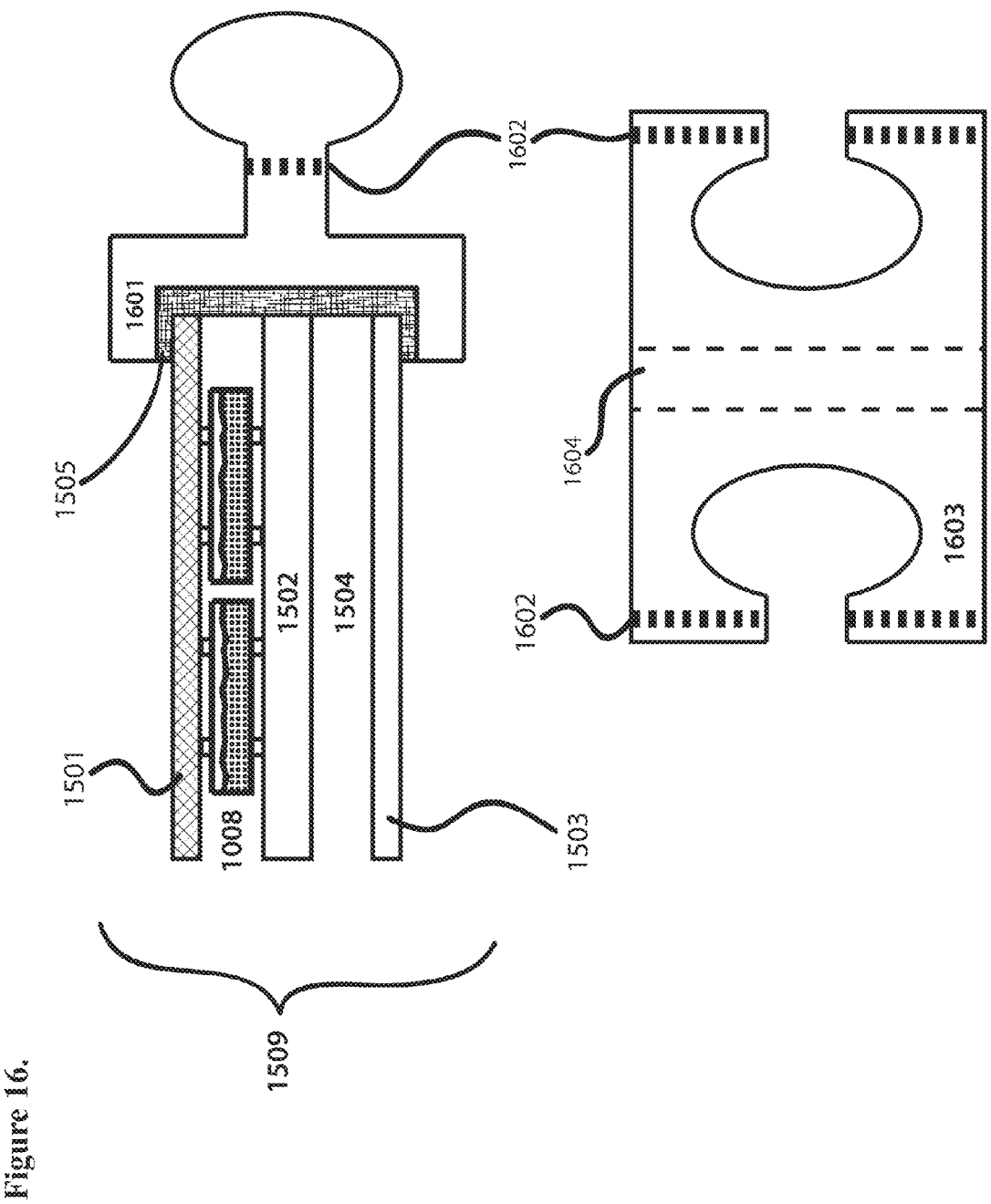
FIG. 16 schematically represents a cross-sectional view of a right-side connection of combined heat and electricity panels in accordance with a nonlimiting embodiment of the invention.

FIG. 16 is a cross-sectional view of the a right-side connection having the following components: an extruded side mount 1603 that attaches the panel to installation structure; an extruded panel bracket 1601 that forms a laterally secured connection when mated with the side mount 1603; and a sealant 1505 to prevent coolant leaks around intersection of the panel bracket 1601 and panes 1501, 1502, and 1503.

FIG. 16 also shows a side view of parallel cell strings 1008 between the top and center panes 1501 and 1502, and the coolant flow layer 1504 is shown between the center and bottom panes 1502 and 1503. Stabilization holes 1602 are present in the panel bracket 1601 and side mount 1603 to prevent transverse motion of the PV panel 1509 along the side mount 1603, and a lower segment of the hole in the side mount 1603 may be threaded. Mounting holes 1604 attach the extruded side mount 1603 and attached panels 1509 to an installation sub-structure (not shown).

Figure 17:
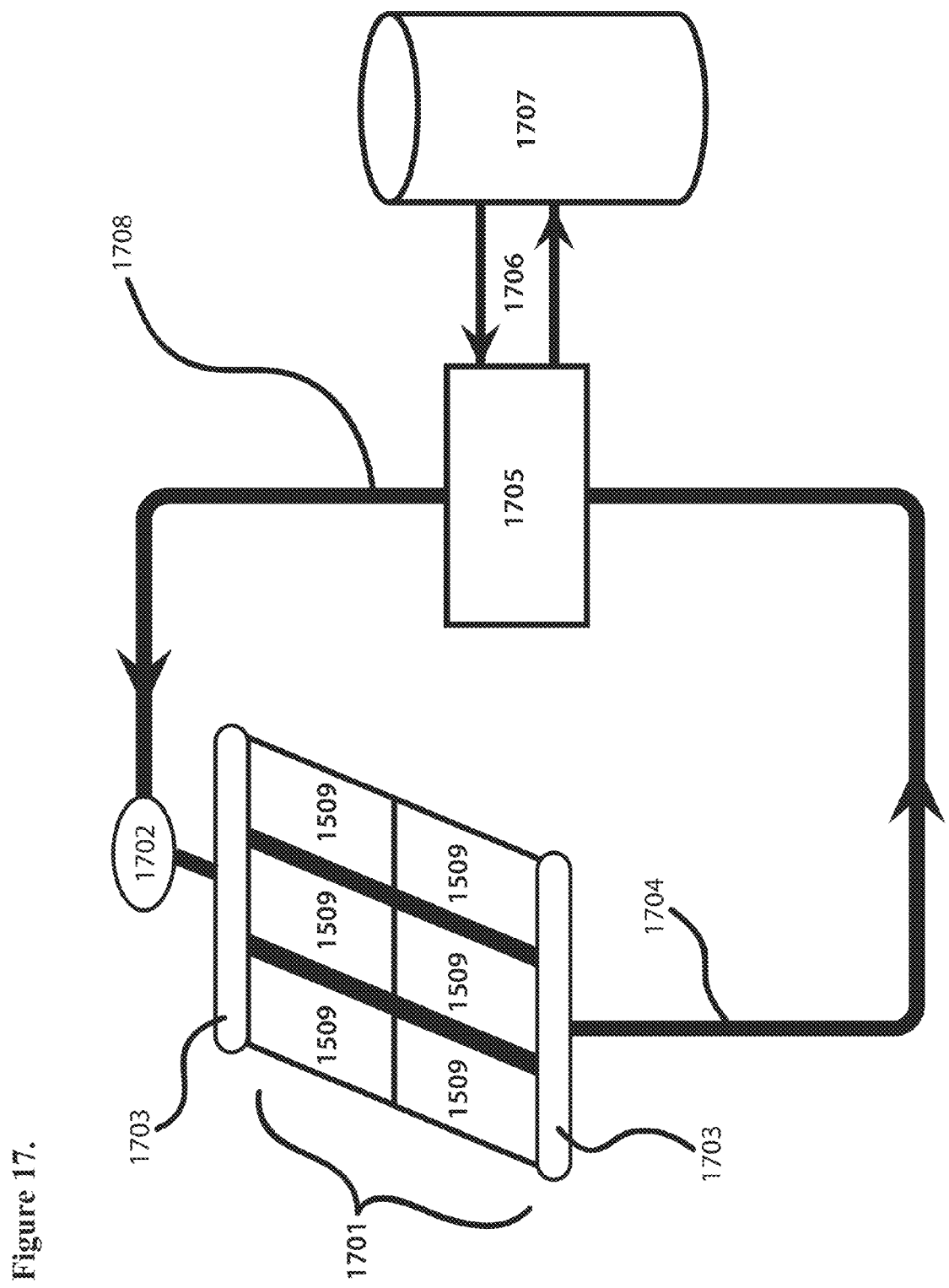
FIG. 17 schematically represents a flow diagram depicting a combined heat and electricity photovoltaic installation in accordance with a nonlimiting embodiment of the invention.

FIG. 17 is a flow diagram for a combined heat and electricity PV installation, and illustrates coolant flow and heat therein. A combined heat/electricity PV array 1701, comprising an array of connected combined heat/electricity PV panels 1509, is connected to array end connectors 1703 comprising the necessary coolant and electrical input and output ports as well as temperature sensors. Solar radiation heats coolant, which flows past the temperature sensors in the end connector 1703. Coolant output piping 1704 connects to a heat exchanger 1705, which transfers heat through a closed system 1706 to a heat storage tank 1707. The coolant loses heat and is pulled through coolant input piping 1708 to a coolant pump 1702 and back through the top connector 1703 to the array 1701.

Figure 18:
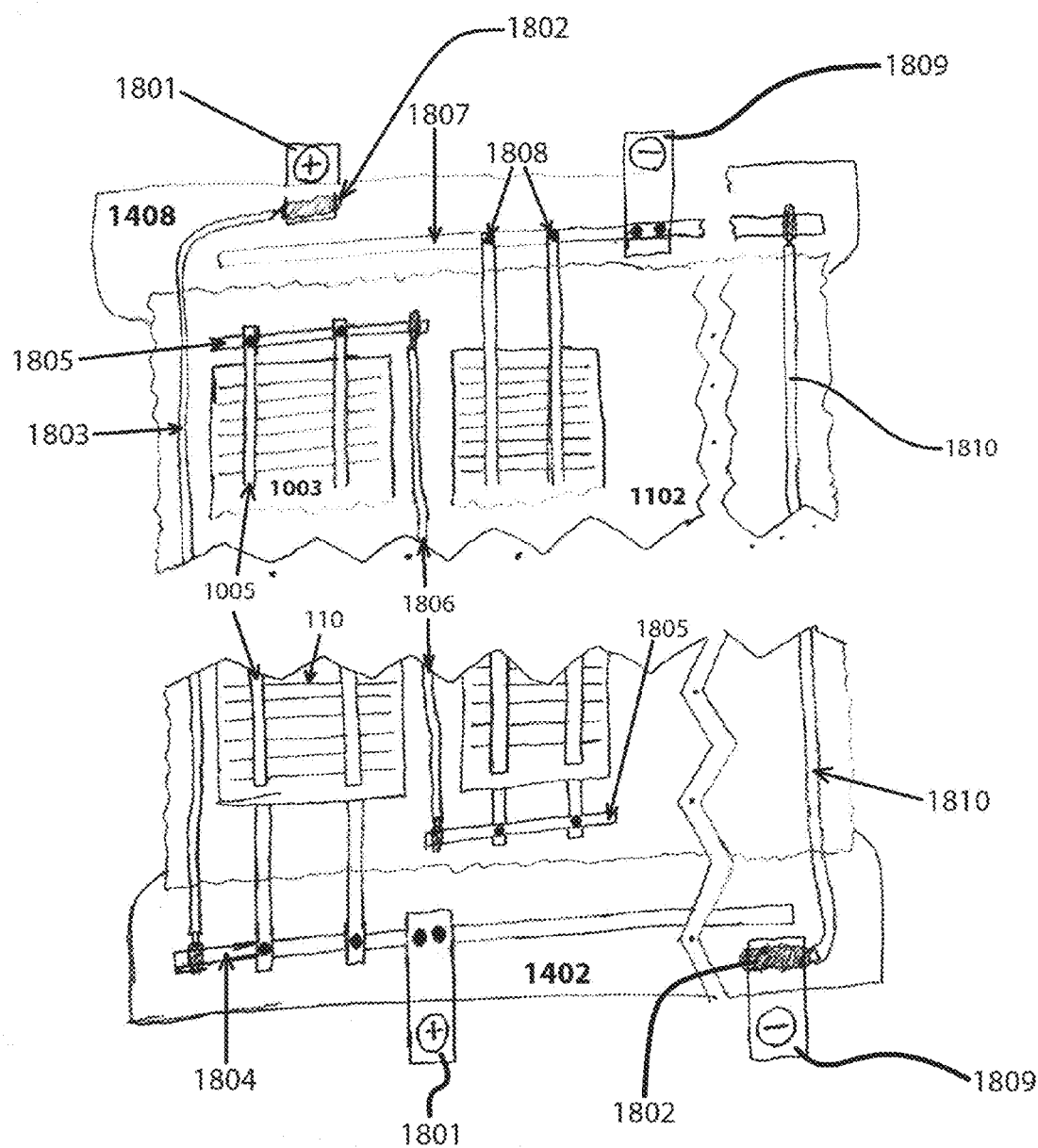
FIG. 18 schematically represents a breakaway diagram of a flexible photovoltaic panel in accordance with a nonlimiting embodiment of the invention.

FIG. 18 is a breakaway diagram of a flexible PV panel, and illustrates corners of the flexible PV panel. The structural steel wire 1403 is not shown in this diagram, but is implied to exist to the right and left of the illustrated cell area. The following elements are as follows: a negative panel electrode 1809; a solder connection 1802 used between a wire and terminal or wire and connecting plate (others in this figure are illustrated similarly); weld spots 1808 (others in the figure are illustrated as dark black dots); a top (female) connector 1408; string interconnecting bars 1805; a positive electrical wire 1803 which interconnects the positive panel electrode 1801 and positive panel bus bar 1804; interconnecting Ribbon 1005; flexible PV Cell 1003, "daisy-chained" with ribbon-connected cells 1006; front contacts 110 of the PV cells 1003; internal connecting wire 1806; bottom (male) connector 1402; and negative electrical wire 1810, interconnecting negative panel electrode 1809, and negative terminal bus bar 1807.

While the invention has been described in terms of specific embodiments, it is apparent that other forms could be adopted by one skilled in the art. Accordingly, it should be understood that the invention is not limited to the specific embodiments illustrated in the Figures. It should also be understood that the phraseology and terminology employed above are for the purpose of disclosing the illustrated embodiments, and do not necessarily serve as limitations to the scope of the invention. For example, the physical configuration of the photovoltaic cell shown in FIG. 1 could differ, the cell could be produced by apparatuses and installed in solar panels that differ from those shown, and materials and processes other than those noted could be used. Therefore, the scope of the invention is to be limited only by the following claims.

The invention claimed is:

1. A wet-chemical synthesis method of producing a Group I-III-VI$_2$ semiconductor material, the method comprising:
    forming a solution in a hermetically-sealed reaction vessel, the solution containing an organic solvent, at least one Group I precursor consisting of at least one compound of at least one Group I element, and at least one Group III precursor consisting of at least one compound of at least one Group III element, wherein the Group I precursor is present in the solution in an amount of less than 120% of a stoichiometric ratio of the at least one Group I element in the Group I-III-VI$_2$ semiconductor material, and the Group III precursor is present in the solution in an amount of greater than 55% of a stoichiometric ratio of the at least one Group III element in the Group I-III-VI$_2$ semiconductor material;
    wherein the forming step comprises a degassing process to produce a first reactant, the degassing process comprises:
    holding the solution at a vacuum level not exceeding 0.05 bar and heating the solution to a first temperature sufficient to boil the organic solvent under the vacuum level; and then
    introducing an atmosphere consisting of at least one of a noble gas, nitrogen gas, and carbon dioxide gas into the reaction vessel to attain a pressure of at least 0.08 bar for at least two seconds.

2. The wet-chemical synthesis method of claim 1, wherein after the atmosphere is introduced into the reaction vessel to attain the pressure of at least 0.08 bar for at least two seconds, the degassing process further comprises repeating steps of holding the reaction vessel at the vacuum level not exceeding 0.05 bar and then reintroducing the atmosphere into the reaction vessel to attain a pressure of at least 0.08 bar for at least two seconds, until the first reactant forms.

3. A wet-chemical synthesis method of producing a Group I-III-VI$_2$ semiconductor material, the method comprising:
    forming a solution in a hermetically-sealed reaction vessel, the solution containing an organic solvent, at least one Group I precursor consisting of at least one compound of at least one Group I element, and at least one Group III precursor consisting of at least one compound of at least one Group III element, wherein the Group I precursor is present in the solution in an amount of less than 120% of a stoichiometric ratio of the at least one Group I element in the Group I-III-VI$_2$ semiconductor material, and the Group III precursor is present in the solution in an amount of greater than 55% of a stoichiometric ratio of the at least one Group III element in the Group I-III-VI$_2$ semiconductor material, the forming step further comprising a degassing process to produce a first reactant; and
    heating the first reactant within the reaction vessel to a temperature greater than 200° C. and then introducing a sulfur solution into the reactor vessel to form a product solution, the sulfur solution being introduced into the reaction vessel at a temperature below the temperature of the first reactant.

4. The wet-chemical synthesis method of claim 3, wherein the sulfur solution contains elemental sulfur dissolved in a solvent to achieve a sulfur concentration of about 1 M to about 4 M and the sulfur solution introduces sulfur into the reaction vessel at least 80% of stoichiometric for sulfur in the Group I-III-VI$_2$ semiconductor material.

5. The wet-chemical synthesis method of claim 3, the method further comprising washing the product solution in a solvent and then treating the product solution to an anti-solvent to yield a dry precipitate comprising nanoparticles and less than 20% by weight solvents.

6. The wet-chemical synthesis method of claim 5, the method further comprising:
    dispersing the nanoparticles in a solvent to form a nanoparticle solution;
    applying the nanoparticle solution to a substrate;
    drying the nanoparticle solution to form a nanoparticle coating on the substrate; and then
    annealing the nanoparticle coating in an atmosphere containing a chalcogen to produce an absorber layer of the Group I-III-VI$_2$ semiconductor material.

7. The wet-chemical synthesis method of claim 6, wherein the nanoparticle solution is applied to a surface region of the substrate comprising a contact layer, the contact layer being an electrically and thermally conductive layer of a metal that forms an ohmic junction with the absorber layer.

8. The wet-chemical synthesis method of claim 6, wherein the chalcogen is at least one chosen from the group consisting of elemental tellurium, selenium, and sulfur.

9. The wet-chemical synthesis method of claim 6, wherein the absorber layer consists of semiconducting photo-absorptive nanocrystals of the Group I-III-VI$_2$ semiconductor material.

10. The wet-chemical synthesis method of claim 6, wherein the substrate is a flexible substrate and dispensed from a roll prior to annealing.

11. The wet-chemical synthesis method of claim 10, further comprising coiling the substrate into a roll after annealing.

12. The wet-chemical synthesis method of claim 6, wherein the annealing step comprises heating the substrate and the nanoparticle coating thereon to a temperature of about 200° C. to about 800° C. for at least four minutes in an atmosphere at a pressure of greater than 0.05 bar, the atmosphere containing elemental selenium vapor and/or at least one gaseous selenium compound.

13. The wet-chemical synthesis method of claim 6, further comprising applying at least one buffer layer over the absorber layer, the buffer layer being an amorphous n-type material having a higher bandgap than the absorber layer.

14. The wet-chemical synthesis method of claim 6, further comprising applying at least one transparent electrically-conductive layer over the absorber layer.

15. The wet-chemical synthesis method of claim 14, wherein the transparent electrically-conductive layer is applied by photo-electroplating bath deposition while illuminated at an intensity of at least 5 lumen.

16. The wet-chemical synthesis method of claim 14, further comprising forming front electrically conductive contacts on the substrate.

* * * * *